US009444476B2

(12) United States Patent
Goka et al.

(10) Patent No.: US 9,444,476 B2
(45) Date of Patent: Sep. 13, 2016

(54) ATOMIC OSCILLATOR AND INTERROGATION METHOD OF COHERENT POPULATION TRAPPING RESONANCE

(71) Applicants: Shigeyoshi Goka, Tokyo (JP); Yuichiro Yano, Tokyo (JP)

(72) Inventors: Shigeyoshi Goka, Tokyo (JP); Yuichiro Yano, Tokyo (JP)

(73) Assignees: RICOH COMPANY, LTD., Tokyo (JP); Tokyo Metropolitan University, Tokyo (JP)

( * ) Notice: Subject to any disclaimer, the term of this patent is extended or adjusted under 35 U.S.C. 154(b) by 0 days.

(21) Appl. No.: 14/420,709

(22) PCT Filed: Aug. 28, 2013

(86) PCT No.: PCT/JP2013/073728
§ 371 (c)(1),
(2) Date: Feb. 10, 2015

(87) PCT Pub. No.: WO2014/034955
PCT Pub. Date: Mar. 6, 2014

(65) Prior Publication Data
US 2015/0222285 A1      Aug. 6, 2015

(30) Foreign Application Priority Data
Aug. 30, 2012   (JP) ................................ 2012-190180

(51) Int. Cl.
*G04F 5/14* (2006.01)
*H03B 17/00* (2006.01)
(Continued)

(52) U.S. Cl.
CPC ................. *H03L 7/26* (2013.01); *G04F 5/145* (2013.01); *H01S 5/0085* (2013.01); *H01S 5/0687* (2013.01); *H03B 17/00* (2013.01)

(58) Field of Classification Search
CPC ......... G04F 5/14; G04F 5/145; H03B 17/00; H03L 7/26; H01S 5/0085
USPC ...................................... 331/3, 94.1
See application file for complete search history.

(56) References Cited

U.S. PATENT DOCUMENTS 5,491,451 A * 2/1996 English .................... H03L 7/26
331/3
6,320,472 B1 11/2001 Vanier
(Continued)

FOREIGN PATENT DOCUMENTS

EP         1577720 A2      9/2005
JP       H03-101419       4/1991
(Continued)

OTHER PUBLICATIONS

International Search Report Issued on Nov. 26, 2013 in PCT/JP2013/073728 filed on Aug. 28, 2013.
(Continued)

*Primary Examiner* — Levi Gannon
(74) *Attorney, Agent, or Firm* — Cooper & Dunham LLP

(57) ABSTRACT

An atomic oscillator includes an alkali-metal cell in which alkali-metal atoms are enclosed, a light source which irradiates the atoms in the alkali-metal cell with laser beams, a photodetector which detects a light amount of the laser beams passing through the alkali-metal cell to enter the photodetector, and a controller which generates sidebands including a pair of laser beams with different wavelengths by performing frequency modulation of a carrier on the light source, causes the pair of laser beams with the different wavelengths to enter the alkali-metal cell, and controls a modulation frequency according to optical absorption characteristics of the atoms by quantum interference effects of a pair of resonance laser beams, wherein the side bands include second-order or higher-order sidebands.

10 Claims, 9 Drawing Sheets

(51) Int. Cl.
*H03L 7/26* (2006.01)
*H01S 5/00* (2006.01)
*H01S 5/0687* (2006.01)

(56) References Cited

U.S. PATENT DOCUMENTS

| | | | |
|---|---|---|---|
| 6,363,091 | B1 | 3/2002 | Zhu et al. |
| 6,993,058 | B2* | 1/2006 | Zhu ............... G04F 5/145 331/3 |
| 7,345,553 | B2* | 3/2008 | Berberian ............ G04F 5/14 331/3 |
| 7,501,906 | B2 | 3/2009 | Dimarcq et al. |
| 2004/0109217 | A1* | 6/2004 | Maleki ............... G04F 5/00 359/239 |
| 2004/0120368 | A1* | 6/2004 | Hayes ............... H03L 7/26 372/26 |
| 2007/0200643 | A1 | 8/2007 | Dimarcq et al. |
| 2009/0289728 | A1* | 11/2009 | Ben-Aroya ......... H03L 7/26 331/94.1 |
| 2010/0201452 | A1 | 8/2010 | Aoyama et al. |
| 2011/0051763 | A1 | 3/2011 | Vanier |
| 2011/0309887 | A1* | 12/2011 | Maki ............... H03L 7/26 331/94.1 |
| 2012/0319785 | A1 | 12/2012 | Aoyama et al. |
| 2013/0015920 | A1 | 1/2013 | Sato et al. |
| 2013/0335155 | A1 | 12/2013 | Sato |
| 2014/0133510 | A1 | 5/2014 | Sato |
| 2014/0320856 | A1* | 10/2014 | McKeever ........ G01J 3/4338 356/326 |
| 2014/0354367 | A1 | 12/2014 | Suzuki et al. |

FOREIGN PATENT DOCUMENTS

| | | |
|---|---|---|
| JP | 2005-217442 | 8/2005 |
| JP | 2007-530965 | 11/2007 |
| JP | 2010-206160 | 9/2010 |
| JP | 2011-061272 | 3/2011 |
| JP | 2011-091476 | 5/2011 |
| JP | 2011-158384 | 8/2011 |
| JP | 4801044 | 10/2011 |
| JP | 2012-209534 | 10/2012 |
| JP | 2013-038382 | 2/2013 |
| JP | 2013-138176 | 7/2013 |
| JP | 2013-243329 | 12/2013 |
| WO | WO01/26231 A1 | 4/2001 |

OTHER PUBLICATIONS

"The MAC—A Miniature Atomic Clock" by R. Lutwak et al., Joint Meeting of the IEEE International Frequency Control Symposium and the Precise Time and Time Interval (PTTI) Systems and Applications Meeting, Vancouver, BC, Canada, pp. 752-757 (2005).

"Investigations on Continuous and Pulsed Interrogation for a CPT Atomic Clock" by N. Castagna et al., IEEE Transactions on Ultrasonics, Ferroelectrics, and Frequency Control, vol. 56, No. 2, pp. 246-253 (2009).

"High contrast Ramsey fringes with coherent-population-trapping pulses in a double lambda atomic system" by T. Zanon, et al., Physical Review Letters, vol. 94, pp. 193002-1-193002-4 (2005).

"A microfabricated atomic clock" by S. Knappe et al., Applied Physics Letters, vol. 85, No. 9, pp. 1460-1462 (2004).

European search report dated Sep. 30, 2015 in corresponding European Patent Application No. 13833816.5.

Boudot, R et al., "Current Status of a Pulsed CPT Cs Cell Clock". IEEE Transactions on Instrumentation and Measurement, vol. 58, No. 4, Apr. 1, 2009, pp. 1217-1222.

Goka, Singeyoshi et al., "Higher-order sideband excitation method for pulsed CPT atomic clock", 2013 Joint European Frequency and Time Forum & International Frequency Control Symposium, IEEE, Jul. 21, 2013, pp. 228-331.

\* cited by examiner

ATOMIC OSCILLATOR AND INTERROGATION METHOD OF COHERENT POPULATION TRAPPING RESONANCE

TECHNICAL FIELD

The present invention relates to an atomic oscillator and an interrogation method of coherent population trapping (CPT) resonance.

BACKGROUND ART

Conventionally, an atomic clock (or atomic oscillator) is known as a clock that provides very precise timing. Recently, research and development for miniaturizing the atomic clock has actively been made. The atomic clock may be considered an oscillator that uses an electronic transition frequency in the microwave region of the electromagnetic spectrum of atoms, such as alkali-metal atoms, as a frequency standard on the basis of the amount of transition energy of electrons in the atoms. In particular, in the absence of external influences, a very precise value of timing can be obtained from the transition energy of the electrons in the alkali-metal atoms. The frequency stability of the atomic clock of this type is at several orders of magnitude better than those of the existing crystal oscillators. For example, see Japanese Patent No. 4,801,044; "The MAC—A Miniature Atomic Clock" by R. Lutwak, P. Vlitas, M. Varghese, M. Mescher, D. K. Serkland and G. M. Peake, Joint Meeting of the IEEE International Frequency Control Symposium and the Precise Time and Time Interval (PTTI) Systems and Applications Meeting, Vancouver, BC, Canada, pp. 752-757 (2005); and "Investigations on Continuous and Pulsed Interrogation for a CPT Atomic Clock" by N. Castagna, R. Boudot, S. Guérandel, E. De Clercq, N. Dimarcq and A. Clairon, IEEE Transactions on Ultrasonics, Ferroelectrics, and Frequency Control, Vol. 56, No. 2, February 2009.

There are some types of the atomic clock. For example, the conventional type utilizing a microwave resonator requires a large device size and high power consumption. However, a CPT (coherent population trapping) atomic clock is capable of providing a very high frequency stability which is at three orders of magnitude better than that of the existing crystal oscillator. Further, the CPT atomic clock is able to provide a small device size and low power consumption. A CPT atomic clock prototype was produced in 2007 and the product of chip-scale atomic clock (CSAC) of this type became available commercially in 2011 by Symmetricom.

Although the CPT atomic clock described above has a power consumption lower than that of the conventional atomic clock utilizing the microwave resonator, the power consumption of the above CPT atomic clock was approximately 115 mW. If the practical use of an atomic clock in battery-driven portable applications is taken into consideration, the power consumption value of the above CPT atomic clock is still too high. Accordingly, there has been a demand for an improved atomic clock or oscillator with a lower power consumption of less than 30 mW.

SUMMARY OF THE INVENTION

In one aspect, the present invention provides an atomic oscillator and an interrogation method of CPT resonance which are adapted to lower the power consumption.

In one embodiment, the present invention provides an atomic oscillator including: an alkali-metal cell in which alkali-metal atoms are enclosed; a light source configured to irradiate the atoms in the alkali-metal cell with laser beams; a photodetector configured to detect a light amount of the laser beams passing through the alkali-metal cell to enter the photodetector; and a controller configured to generate sidebands including a pair of laser beams with different wavelengths by performing frequency modulation of a carrier on the light source, cause the pair of laser beams with the different wavelengths to enter the alkali-metal cell, and control a modulation frequency according to optical absorption characteristics of the atoms by quantum interference effects of a pair of resonance laser beams, wherein the sidebands include second-order or higher-order sidebands.

DESCRIPTION OF THE EMBODIMENTS

A description will be given of embodiments of the invention with reference to the accompanying drawings.

First Embodiment

As a result of the investigation of the above-described CPT atomic clock according to the related art, it is found that more than half of power of the CPT atomic clock is consumed by microwave related circuits including a microwave oscillator and a PLL (phase-locked loop). Specifically, the power consumption of the CPT atomic clock at bands of several GHz (gigahertz) is mainly caused by the switching loss when the CPT atomic clock is operated at RF (radio frequency) bands. The switching loss P is represented by Formula 1 below.

$$P = f_{RF}CV^2 \qquad \text{[Formula 1]}$$

where $f_{RF}$ denotes a frequency of an RF drive, C denotes a parasitic capacitance, and V denotes an amplitude of the radio frequency. In view of Formula 1, the conceivable approaches for reducing the power consumption of the microwave related circuits may include: to lower the RF frequency $f_{RF}$; to lower the parasitic capacitance C; and to lower the amplitude V of the radio frequency.

An atomic oscillator according to the present embodiment is adapted for reducing the power consumption of the atomic oscillator by using the approach of lowering the RF frequency $f_{RF}$ among the above approaches. Specifically, the atomic oscillator according to the present embodiment is arranged to lower the RF frequency $f_{RF}$ as a fundamental wave by using the higher-order harmonics (sidebands), such as the second-order sidebands or the third-order sidebands, so that the power consumption may be reduced.

Figure 1:
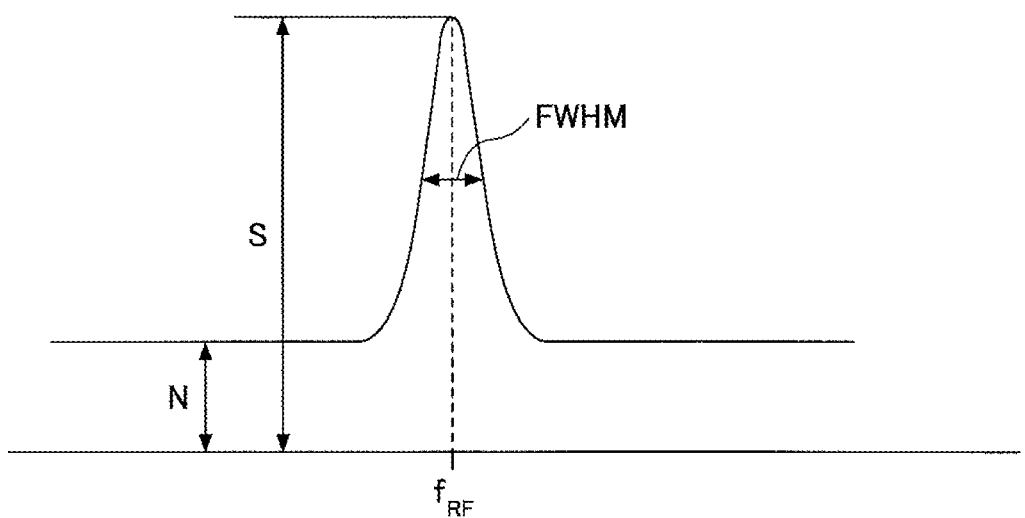
FIG. 1 is a diagram for explaining a distribution of laser intensity.

Generally, if the higher-order sidebands are used in an atomic oscillator, the efficiency of generation of a laser beam at the wavelength necessary for CPT interrogation may fall, and thus the contrast at the CPT resonance may fall. High frequency stability is required for the atomic oscillator. Especially when the atomic oscillator is employed as a timing standard source for a base station of various radio communication devices, a short-term frequency stability of the atomic oscillator becomes important. In this regard, the Allan deviation is a measure of frequency stability, and a short-term frequency stability $\sigma_y(\tau)$ is represented by Formula 2 blow.

$$\sigma_y(\tau) \propto \frac{1}{Q(S/N)\sqrt{\tau}} \quad \text{[Formula 2]}$$

where $\tau$ is the observation time, S/N is an S(signal)/N (noise) ratio denoting the ratio of the intensity at the RF frequency $f_{RF}$ to the noise, and Q denotes a resonance Q value of atomic resonance. Further, the Q is represented by Formula 3 below.

$$Q = \frac{f_{RF}}{FWHM} \quad \text{[Formula 3]}$$

where FWHM (full-width at half maximum) is a line-width of a laser corresponding to a half of the maximum intensity in the laser power distribution at the RF frequency $f_{RF}$, and in the present embodiment. The FWHM may also be referred to as the contrast Ct. FIG. 1 shows a distribution of laser intensity (laser spectra).

In view of the foregoing description, the short-term frequency stability $\sigma_y(\tau)$ in Formula 2 may also be represented by Formula 4 below.

$$\sigma_y(\tau) = K \frac{FWHM}{Ct \cdot f_{RF}} = \frac{K}{Q \cdot Ct} \quad \text{[Formula 4]}$$

As is apparent from Formula 4, the short-term frequency stability $\sigma_y(\tau)$ is determined depending on the resonance Q value of atomic resonance and the contrast Ct (S/N ratio). Namely, the short-term frequency stability $\sigma_y(\tau)$ may be made small by increasing the resonance Q value of atomic resonance or the contrast Ct. Upon occurrence of CPT resonance, a large resonance amplitude may be obtained by increasing the intensity of the laser beam. However, at the same time, the line-width will increase due to the power broadening effect. Thus, as a general rule, there may be a performance trade-off between a scheme of increasing the Q value and a scheme of increasing the contrast Ct (S/N ratio).

The atomic oscillator according to the present embodiment uses a pulsed interrogation of laser beams which compensates for the fall of the contrast in the higher-order sidebands and reduces the power consumption so that the stability of the atomic oscillator is increased.

In the following, atoms of an interactive medium, such as caesium atoms, are excited between two energy levels, and this excitation mode is referred to as a "continuous interrogation mode" (or the "Rabi interrogation") if the interaction is continuous, and as a "pulsed interrogation mode" (or the "Ramsey interrogation") if the interaction is based on two short interactions separated by a dead time. In this regard, the pulsed interrogation mode enables the Ramsey interrogation, whereby narrowing of the resonance line-width and reduction of the light shift may be achieved. There are several methods of obtaining a pulsed laser beam. In a direct modulation method in which a driving current of a laser for excitation is controlled directly is used, the output wavelength of a laser beam changes greatly at the time of modulation. The direct modulation method cannot be used for an atomic oscillator. In the present embodiment, the modulation for obtaining pulsed laser beams from emitted laser beams of the laser source is performed using an acousto-optic modulator (AOM).

[Atomic Oscillator]

Figure 2:
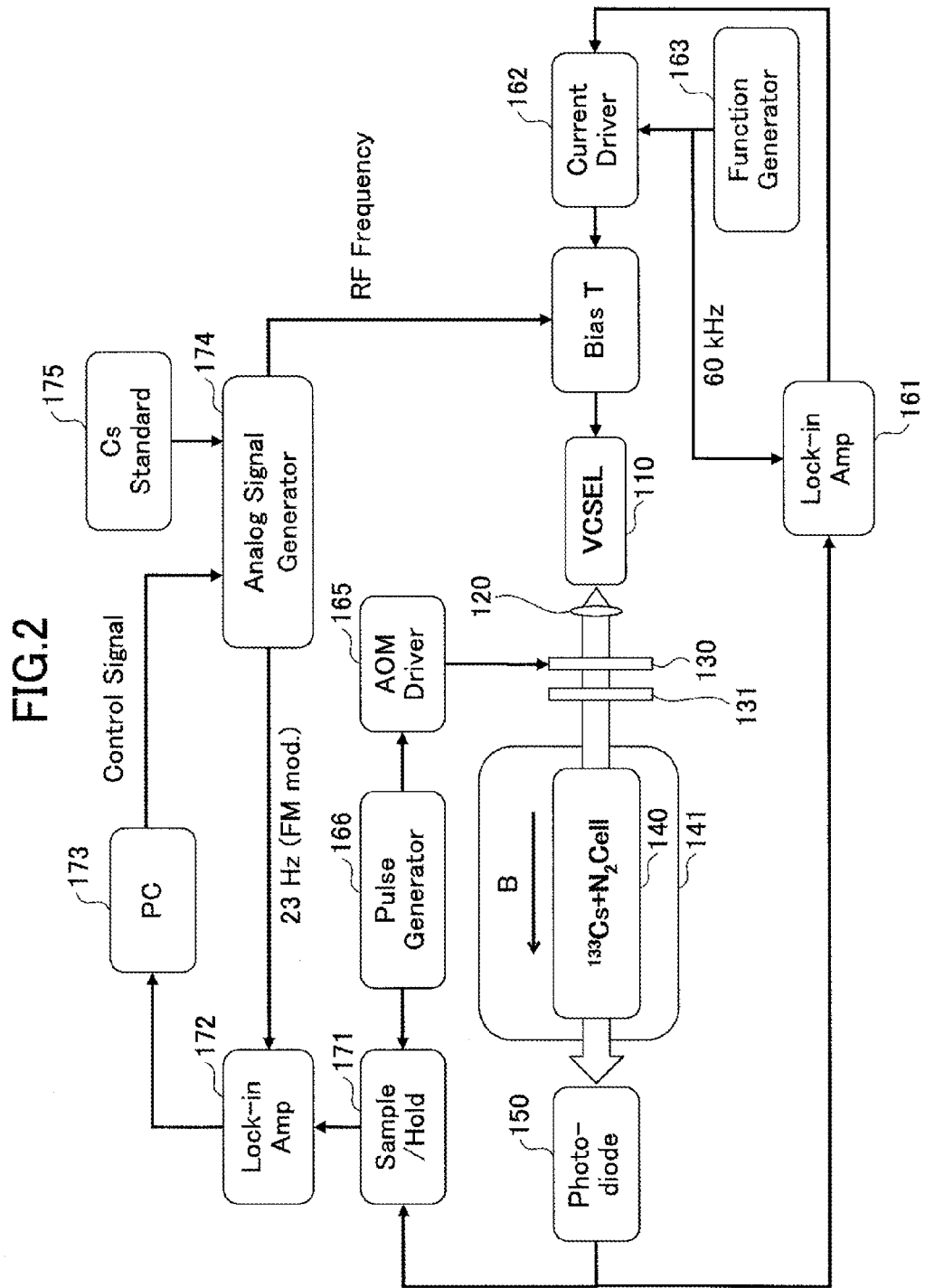
FIG. 2 is a diagram showing the configuration of an atomic oscillator according to a first embodiment of the invention.

Next, a configuration of the atomic oscillator according to the present embodiment will be described with reference to FIG. 2. As shown in FIG. 2, the atomic oscillator of the present embodiment includes a laser source 110, a collimator lens 120, an AOM (acousto-optic modulator) 130, a polarizer 131, an alkali-metal cell 140, and a photodetector (photodiode) 150.

The laser source 110 is a laser for excitation of atoms in the alkali-metal cell 140. In the present embodiment, a vertical-cavity surface emitting laser (VCSEL) is used as the laser source 110. The laser source 110 according to the present embodiment is able to emit a laser beam with a wavelength of 895 nm. This wavelength of the laser beam emitted by the laser source 110 is almost equivalent to the D1 line of $^{133}Cs$ (caesium-133 atoms). The VCSEL is a small-sized chip which is able to emit a laser beam with low power consumption, and the use of the VCSEL as the laser source 110 advantageously enables the power consumption of the atomic oscillator to be lowered further.

The alkali-metal cell 140 is provided in a cylindrical form which has, for example, a diameter of 22.5 mm and an optical path length of 20.0 mm. This alkali-metal cell 140 is filled with alkali-metal atoms Cs and nitrogen gas $N_2$ as buffer gas. The atoms Cs and the nitrogen gas $N_2$ are enclosed in the alkali-metal cell 140. The pressure of the internal space of the alkali-metal cell 140 is maintained at a pressure of 1.3 kPa.

In the present embodiment, the laser beams emitted by the laser source 110 are passed through the collimator lens 120, the AOM 130 and the polarizer 131, so that polarized laser beams with a beam diameter of approximately 5 mm enter the alkali-metal cell 140. The input laser beams incident to the alkali-metal cell 140 penetrates the alkali-metal cell 140, and the output laser beams outgoing from the alkali-metal cell 140 enter the photodetector 150. The photodetector 150 is made of a photodiode and provided to detect the amount of light, etc. of the laser beams incident to the photodetector 150.

In the present embodiment, the emitted laser beams from the laser source 110, before entering the alkali-metal cell 140, are modulated into pulsed laser beams by the AOM 130. The AOM 130 is configured to perform high-speed modulation and the pulsed laser beams as a result of the modulation by the AOM 130 may have a waveform in the form of a square wave.

In the present embodiment, to stabilize the wavelength of the laser beams emitted from the laser source 110, a lock-in amplifier 161 is provided to perform lock-in detection and output a signal indicating the result of the lock-in detection to a current driver 162, so that the amount of current supplied by the current driver 162 to drive the VCSEL as the laser source 110 is controlled according to the result of the lock-in detection. This control of the lock-in amplifier 161 and the current driver 162 is configured to maximize the optical absorption characteristics of the alkali-metal atoms in the alkali-metal cell 140. The temperature of the VCSEL as the laser source 110 is maintained at a constant temperature. In order to implement such operation of the lock-in amplifier 161 and the current driver 162, a function generator 163 is connected to each of the lock-in amplifier 161 and the current driver 162.

To observe the CPT resonance which shows the least possible changes to a magnetic field, the alkali-metal cell 140 is arranged so that a static magnetic field "B" of 32 µT is supplied to the alkali-metal cell 140 by Helmholtz coils (not shown), and the CPT resonance is selectively determined by causing the Zeeman splitting. The Zeeman splitting (or the Zeeman effect) is the effect of splitting a spectral line into several components in the presence of a static magnetic field. To eliminate the external magnetic field by the earth's magnetism, etc., the alkali-metal cell 140 and the Helmholtz coils are covered with magnetic shields and installed in a temperature container 141. The temperature of the alkali-metal cell 140 is maintained at a constant temperature. In the present embodiment, the temperature of the alkali-metal cell 140 is maintained at a temperature in a range between 30 deg. C. and 55 deg. C. For example, it is preferred to maintain the temperature of the alkali-metal cell 140 at 42.00 deg. C. at which the contrast of the CPT resonance becomes the maximum.

Figure 3:
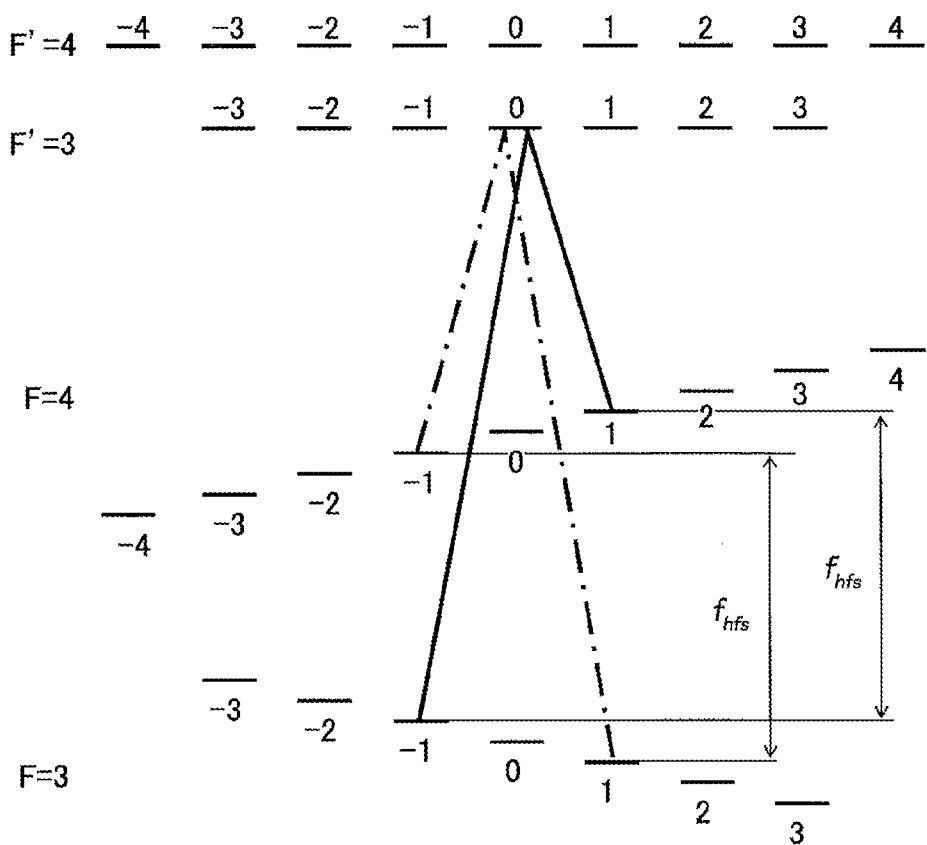
FIG. 3 is a diagram for explaining the $D_1$ line of $^{133}Cs$ (caesium-133 atoms).

The polarizer 131 is provided to produce linearly polarized laser beams as the laser beams for interrogation of CPT resonance, in order to avoid the deviation of the Zeeman sublevels. As shown in FIG. 3, the resonance in which two CPT resonances: (F=3, m=−1), (F=4, m=1); and (F=3, m=1), (F=4 and m=−1) are superimposed is observed in the atomic oscillator according to the present embodiment.

Further, in the atomic oscillator according to the present embodiment, after the pulsed laser beams are produced from the emitted laser beams of the laser source 110 by the AOM 130, the primary diffracted light beams corresponding to the pulsed laser beams are sent to the alkali-metal cell 140. An AOM driver 165 is provided to control the operation of the AOM 130. For example, the AOM driver 165 is configured so that the rise time of the pulsed laser beams is 65 ns in the nominal value, the pulse cycle thereof is 1.00 kHz and the duty ratio thereof is 50%. In this case, the time interval between a falling edge and a rising edge of each pulse of the pulsed laser beams is 500 µs. A sample/hold circuit 171 is provided as a detector which detects the CPT Ramsey interrogation (or the CPT resonance). The sample/hold circuit 171 acquires or picks up the resonance waveform at a timing of 10 µs immediately after a rising edge of each pulse of the pulsed laser beams, and the waveform acquisition time of the sample/hold circuit 171 is 5.0 µs. An output signal indicating the light quantity detected by the photodetector 150 is supplied to each of the sample/hold circuit 171 and the lock-in amplifier 172 and further supplied to a control unit 173 (which may be formed by a personal computer (PC)) through the sample/hold circuit 171 and the lock-in amplifier 172. The control unit 173 is configured to output a control signal to an analog signal generator 174 in response to the output signal from the photodetector 150. The analog signal generator 174 is configured to output an FM (frequency modulation) signal to a lock-in amplifier 172 in response to the control signal from the control unit 173. A Cs standard unit 175 is provided as a reference frequency source and connected to the analog signal generator 174. To implement the foregoing operation of the atomic oscillator, a pulse generator 166 is connected to each of the sample/hold circuit 171 and the AOM driver 165.

To observe the CPT resonance in the atomic oscillator according to the present embodiment, it is necessary to irradiate the alkali-metal atoms in the alkali-metal cell 140 with a pair of laser beams having different wavelengths (or different frequencies).

Figure 4:
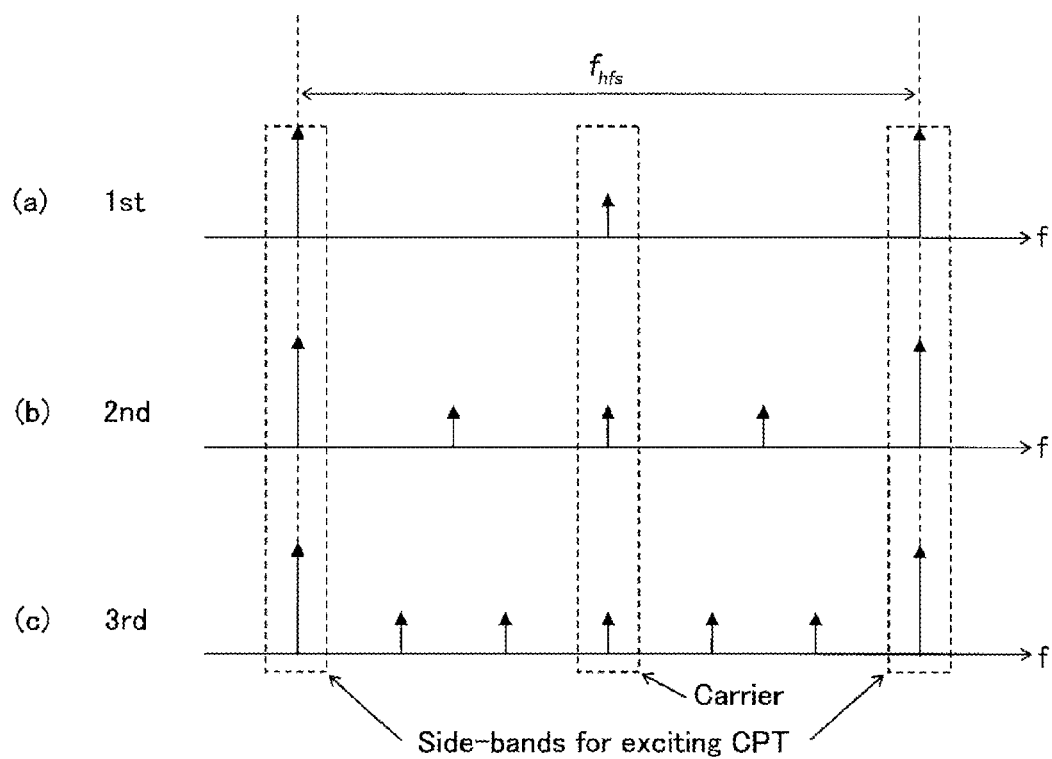
FIG. 4 is a diagram for explaining the first-order, second-order and third-order sidebands.

Conventionally, the pair of laser beams having different wavelengths was obtained by performing FM modulation of a carrier on the laser source and using the resulting first-order sidebands as indicated by (a) in FIG. 4.

On the other hand, the atomic oscillator according to the present embodiment is arranged to obtain the pair of laser beams having different wavelengths by performing FM modulation of the carrier on the laser source 110 by using the AOM 130 which produces the second-order and third-order sidebands as indicated by (b) and (c) in FIG. 4. Thus, if the second-order sidebands are used in the atomic oscillator according to the present embodiment, the modulation frequency (RF frequency) of the atomic oscillator can be reduced to half of the modulation frequency in the conventional case in which the first-order sidebands are used. If the third-order sidebands are used in the atomic oscillator according to the present embodiment, the modulation frequency (RF frequency) of the atomic oscillator can be reduced to one third of the modulation frequency in the conventional case in which the first-order sidebands are used.

Specifically, as shown in Table 1 below, the RF frequency when the first-order sidebands are used in the conventional case is approximately 4.60 GHz, while the RF frequency when the second-order sidebands are used in the atomic oscillator according to the present embodiment is approximately 2.30 GHz. Further, the RF frequency when the third-order sidebands are used in the atomic oscillator according to the present embodiment is approximately 1.53 GHz. As is apparent from Formula 1 above, the switching loss P is proportional to the magnitude of the RF frequency $f_{RF}$, and if the second-order or third-order sidebands are used, the RF frequency $f_{RF}$ can be lowered and thus the power consumption can be reduced.

TABLE 1

| Side band | RF Frequency | |
|---|---|---|
| $1^{st}$-$1^{st}$ | 4.60 GHz | $f_{hfs}/2$ |
| $2^{nd}$-$2^{nd}$ | 2.30 GHz | $f_{hfs}/4$ |
| $3^{rd}$-$3^{rd}$ | 1.53 GHz | $f_{hfs}/6$ |

Figure 5:
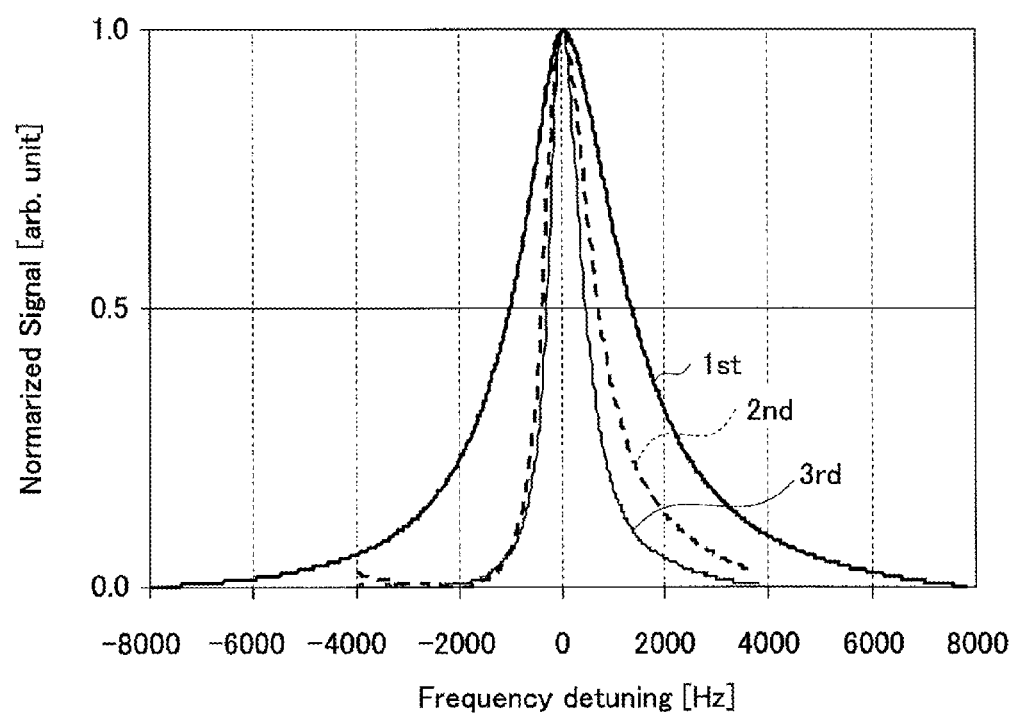
FIG. 5 is a diagram showing results of observations of CPT resonance in a continuous interrogation mode.

Next, the resonance line-width characteristics in CPT interrogation when the second-order or third-order sidebands are used will be described. In the following, the higher-order harmonics, such as the second-order sidebands or the third-order sidebands, may be referred to as the higher-order sidebands. FIG. 5 shows results of observations of CPT resonance in the continuous interrogation mode. In FIG. 5, the vertical axis indicates the signal level of CPT resonance, and the horizontal axis indicates the amount of frequency detuning from the center frequency. The signal level shown in FIG. 5 is expressed with a normalized signal level. Table 2 shows results of observations of the contrast, the FWHM, etc. when the first-order sidebands, the second-order sidebands and the third-order sidebands are used in each of the continuous interrogation mode (CW) and the pulsed interrogation mode (PL).

TABLE 2

|  | Side-Band | Contrast (%) | RF Frequency (GHz) | FWHM | Q value | Figure of Merit (Q value × Contrast) | Relative Figure of Merit |
|---|---|---|---|---|---|---|---|
| CW | 1st | 3.3 | 4.596 325 | 2.32 kHz | $1.98 \times 10^6$ | $6.53 \times 10^6$ | 1.00 |
|  | 2nd | 0.7 | 2.298 162 | 1.09 Hz | $2.10 \times 10^6$ | $1.47 \times 10^6$ | 0.225 |
|  | 3rd | 0.8 | 1.532 108 | 700 Hz | $2.18 \times 10^6$ | $1.74 \times 10^6$ | 0.266 |
| PL | 1st | 5.3 | 4.596 325 | 406 Hz | $1.13 \times 10^7$ | $5.99 \times 10^7$ | 9.17 |
|  | 2nd | 1.4 | 2.298 162 | 216 Hz | $1.05 \times 10^7$ | $1.47 \times 10^7$ | 2.25 |
|  | 3rd | 1.8 | 1.532 108 | 142 Hz | $1.08 \times 10^7$ | $1.94 \times 10^7$ | 2.97 |

In the observation results of Table 2 above, a value of the RF power at which the contrast becomes the maximum has been used. The RF frequency necessary for CPT interrogation when the first-order sidebands are used is 4.596325 GHz, while the RF frequency necessary for CPT interrogation when the second-order sidebands are used is 2.298162 GHz. Namely, when the second-order sidebands are used, it is possible to observe the CPT resonance with the RF frequency which is reduced to half of the RE frequency when the first-order sidebands are used. Similarly, the RF frequency necessary for CPT interrogation when the third-order sidebands are used is 1.532108 GHz. When the third-order sidebands are used, it is possible to observe the CPT resonance with the RF frequency which is reduced to one third of the RF frequency when the first-order sidebands are used.

In the CPT resonance in the continuous interrogation mode, the use of higher-order sidebands causes the line-width FWHM to slightly decrease and causes the Q value to slightly increase. It can be understood that this phenomenon occurs due to the power broadening effect of the laser. The power broadening effect is an effect whereby the line-width FWHM of the laser is broadened in proportion to the laser intensity itself. Higher laser intensity leads to a larger line-width. The use of higher-order sidebands causes the laser intensity of the wavelength components contributing to the CPT resonance to decrease and causes the laser intensity to decrease. Hence, it can be understood that the line-width FWHM becomes narrow due to the decrease of the laser intensity.

Figure 6:
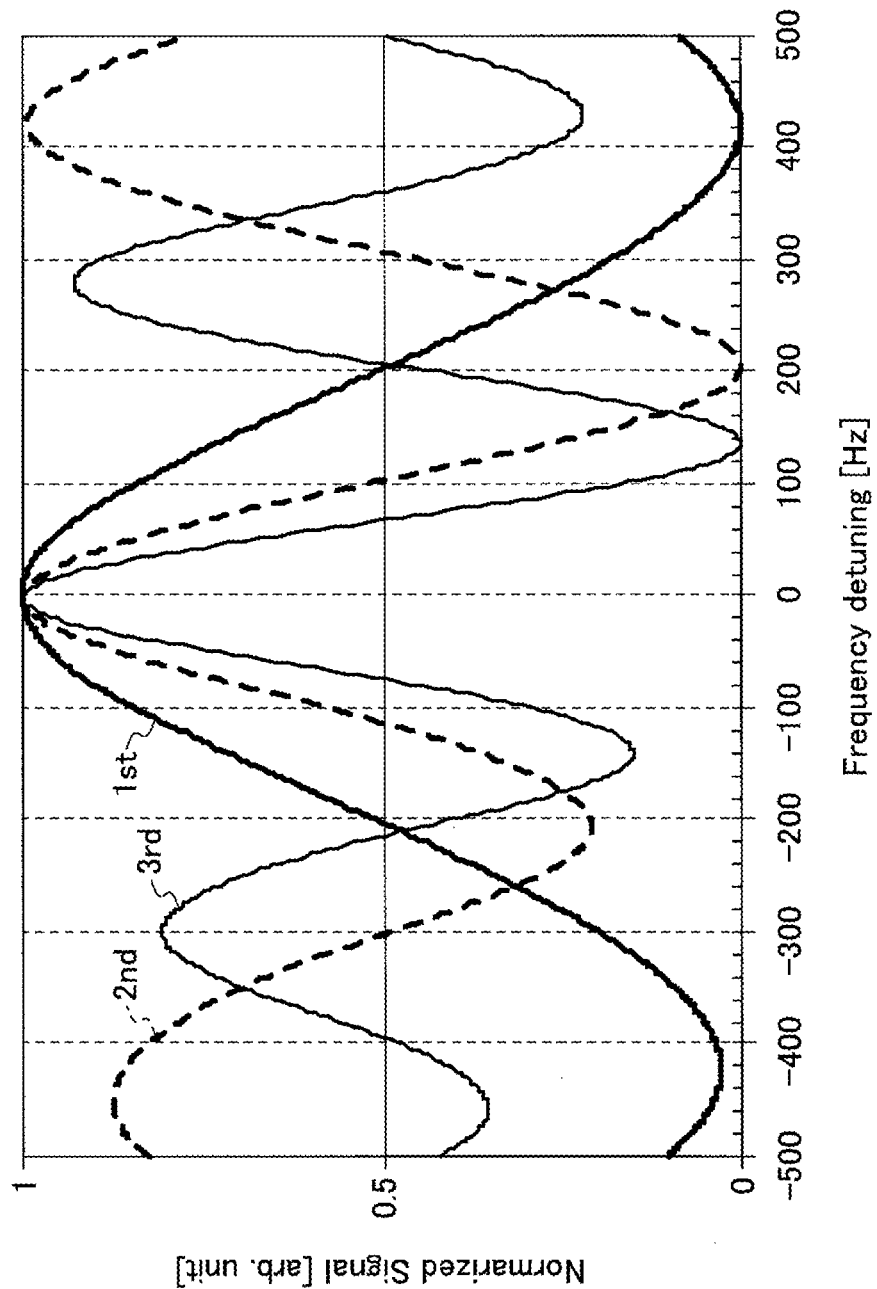
FIG. 6 is a diagram showing results of observations of CPT resonance in a pulsed interrogation mode.

Next, FIG. 6 shows results of observations of the CPT Ramsey resonance in the pulsed interrogation mode. In FIG. 6, the vertical axis indicates the signal level of CPT resonance, and the horizontal axis indicates the amount of frequency detuning from the center frequency. The signal level shown in FIG. 6 is expressed with a normalized signal level. In the pulsed interrogation mode, the Q value when the higher-order sidebands are used remains almost unchanged. It can be understood that the power broadening effect is inhibited in the pulsed interrogation mode and the line-width FWHM does not depend on the laser intensity.

Figure 7:
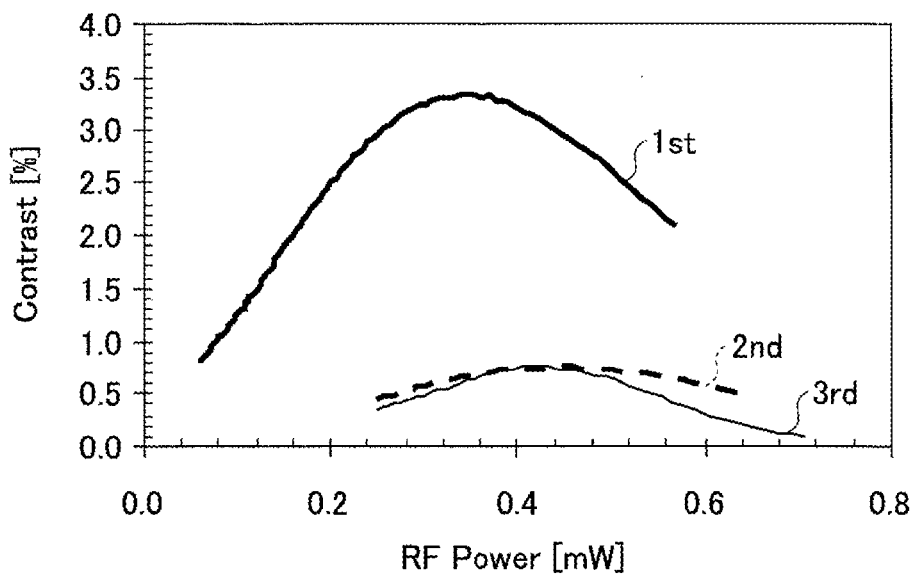
FIG. 7 is a diagram for explaining the correlation between the RF power and the contrast in the continuous interrogation mode.
Figure 8:
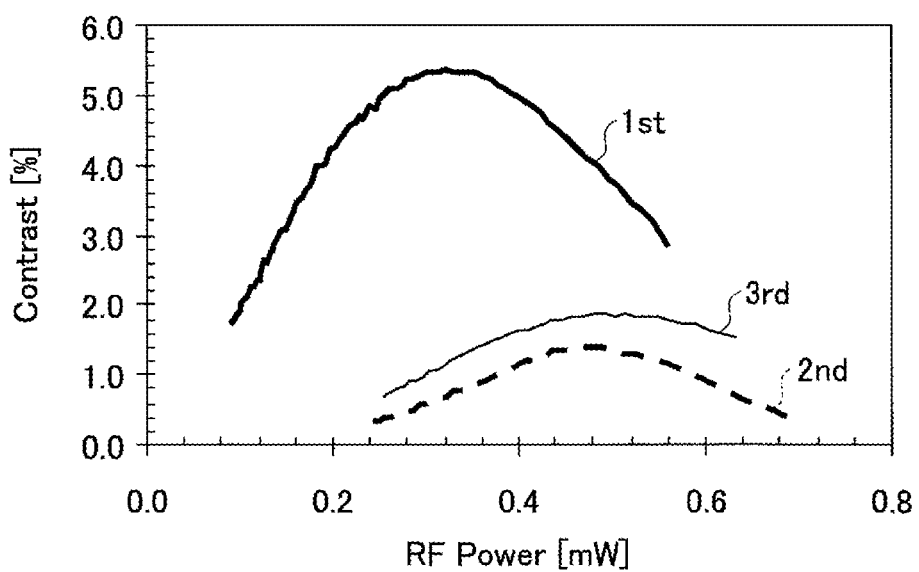
FIG. 8 is a diagram for explaining the correlation between the RF power and the contrast in the pulsed interrogation mode.

FIGS. 7 and 8 show the correlation between the RF power and the contrast. Specifically, FIG. 7 shows the correlation between the RF power and the contrast in the continuous interrogation mode, and FIG. 8 shows the correlation between the RF power and the contrast in the pulsed interrogation mode. As shown in FIGS. 7 and 8, there is a point in the RF power at which the contrast becomes the maximum in both the continuous interrogation mode and the pulsed interrogation mode, respectively. The maximum of the contrast in the CPT interrogation using the higher-order sidebands is lowered from that in the CPT interrogation using the first-order sidebands. This is because the ratio of the wavelength components contributing to the CPT resonance changes depending on the modulation factor. In the continuous interrogation mode, the value of the RF power when the contrast is the maximum in the first-order sideband case was approximately 0.32 mW, and the value of the RF power when the contrast is the maximum in the second-order or third-order sideband case was approximately 0.50 mW. The RF power supplied to the VCSEL as the laser source 110 was 1 mW or less, and the power consumption of the microwave related circuits of the prototype was 66 mW. Hence, it can be understood that 98% or more of the power consumption of the microwave related circuits is caused by the switching loss.

In the atomic oscillator according to the present embodiment, the CPT interrogation in the higher-order sidebands is used. Specifically, in the case in which the second-order sidebands are used, the power consumption of the microwave related circuits was 28.5 (=57/2) mW, the power consumption of the atomic oscillator was 79.5 (=51+28.5) mW, and the power consumption was reduced 26.4%. In the case in which the third-order sidebands are used, the power consumption of the microwave related circuits was 19 (=57/3) mW, the power consumption of the atomic oscillator was 70 (=51+19) mW, and the power consumption was reduced 35.2%. Therefore, the power consumption of the atomic oscillator according to the present embodiment can be reduced remarkably.

In the CPT interrogation using the higher-order sidebands according to the present embodiment (FIG. 8), the second-order sideband case and the third-order sideband case will be compared with each other. The contrast in the third-order sideband case is higher than that in the second-order sideband case. The difference between the CPT interrogation levels F'=3 and F'=4 is 1.167 GHz, and these CPT interrogation levels are in the close vicinity of the RF frequency in the third-order sideband case. Hence, it appears that there is a possibility that the CPT interrogations at both the CPT interrogation levels F'=3 and F'=4 occur simultaneously.

The short-term frequency stability of the atomic oscillator is determined depending on the product of the Q value and the contrast. As shown in Table 2 above, if the product of the Q value and the contrast (Figure of Merit) in the first-order case of the continuous interrogation mode is considered a reference level (=1.0), the product of the Q value and the contrast (Figure of Merit) in the third-order case of the pulsed interrogation mode is 2.97 times larger than the reference level. Therefore, the combination of the pulsed interrogation mode the use of the higher-order sidebands enables the RF frequency to be lowered, and the power consumption can be effectively reduced and the short-term frequency stability can be increased.

Next, the light shift will be described. The light shift is a phenomenon in which the center frequency of CPT resonance shifts in accordance with the quantity of light of laser beams. The light shift is a major factor which degrades the long-term frequency stability of a CPT atomic oscillator. It is known that in the case of the continuous interrogation mode the CPT resonance frequency linearly shifts relative to the laser intensity. It is also reported that the amount of the light shift varies depending on the sidebands unnecessary for CPT resonance.

Figure 9:
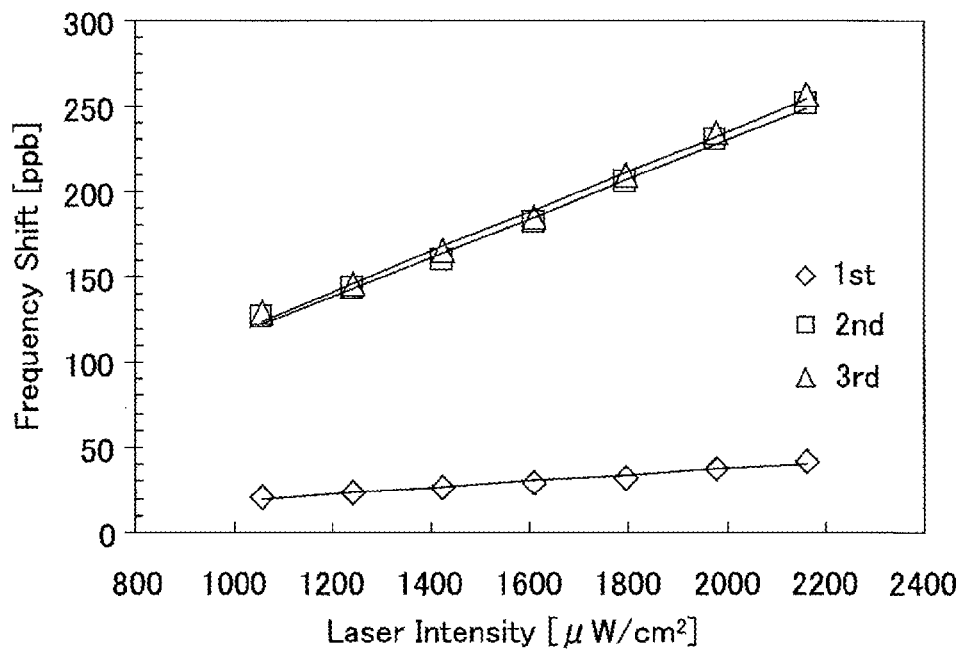
FIG. 9 is a diagram for explaining the correlation between the laser intensity and the frequency shift in the continuous interrogation mode.
Figure 10:
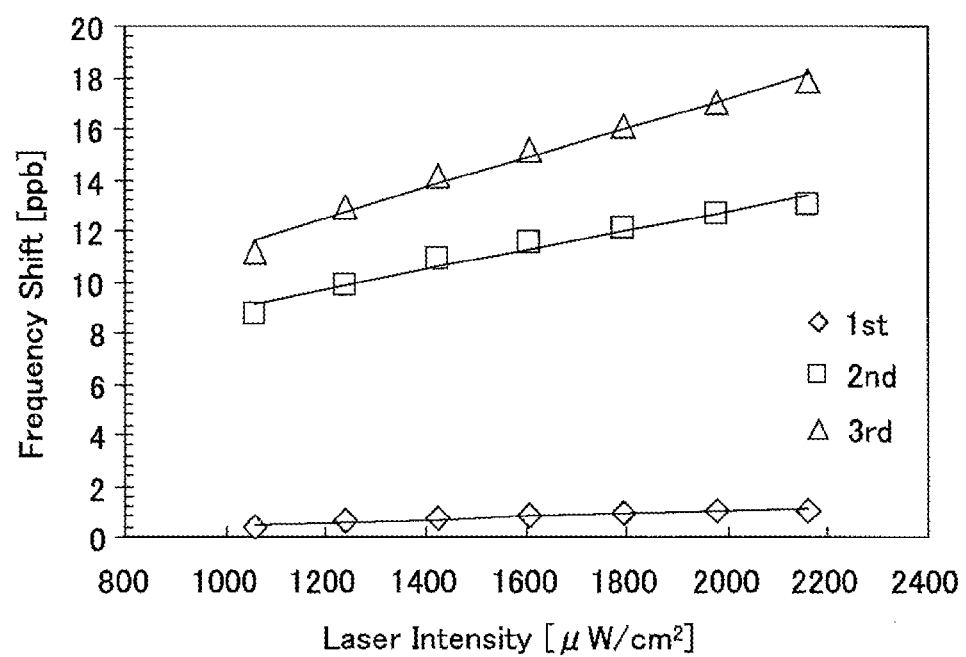
FIG. 10 is a diagram for explaining the correlation between the laser intensity and the frequency shift in the pulsed interrogation mode.

FIG. 9 and FIG. 10 show the correlation between the light intensity and the frequency shift in the CPT resonance. Specifically, FIG. 9 shows the correlation between the laser light intensity and the frequency shift in the continuous interrogation mode, and FIG. 10 shows the correlation between the laser light intensity and the frequency shift in the pulsed interrogation mode. Table 3, below, shows the values of the light shift amount (which is equivalent to the gradient of the frequency shift relative to the laser light intensity) and the values of the relative light shift (which is obtained by dividing the light shift amount by the RF frequency) when the first-order sidebands, the second-order sidebands and the third-order sidebands are used in each of the continuous interrogation mode (CW) and the pulsed interrogation mode (PL). The relative light shift in Table 3 below is equivalent to each of the gradients of the correlation charts in FIG. 9 and FIG. 10.

TABLE 3

|    | Side-Band | Light Shift (mHz/(μW/cm$^2$)) | Relative Light Shift (10$^{-12}$/(μW/cm$^2$)) |
|----|-----------|-------------------------------|------------------------------------------------|
| CW | 1st       | 85.7                          | 18.6                                           |
|    | 2nd       | 265                           | 115                                            |
|    | 3rd       | 180                           | 118                                            |
| PL | 1st       | 2.98                          | 0.602                                          |
|    | 2nd       | 8.79                          | 3.82                                           |
|    | 3rd       | 8.98                          | 5.86                                           |

In the continuous interrogation mode (CW), the light shift amounts in the second-order and third-order cases were 2 to 3 times larger than the light shift amount in the first-order case, and the light shift amount in the second-order case was larger than that in the third-order order. It appears that the cause of this phenomenon is the presence of the sidebands unnecessary for the CPT resonance. The relative light shifts in the second-order and third-order cases were approximately 6 times larger than that in the first-order case.

On the other hand, in the pulsed interrogation mode (PL), the light shift amount in the CPT Ramsey resonance was smaller than that in the case of the continuous interrogation mode. Specifically, the light shift amount in the pulsed interrogation mode was 1/20 to 1/30 of that in the continuous interrogation mode, and the light shift amount can be remarkably reduced by the pulsed interrogation mode.

Moreover, in the pulsed interrogation mode, the light shift amounts in the higher-order cases were about 3 times larger than the light shift amount in the first-order case, and the light shift amount in the second-order case was almost the same as that in the third-order case. The relative light shifts in the higher-order cases were 6 to 10 times larger than that in the first-order case.

As described above, the light shift amount in the case of the pulsed interrogation mode using the higher-order sidebands may be smaller than that in the case of the continuous interrogation mode using the first-order sidebands. Specifically, the relative light shift in the case of the pulsed interrogation mode using the third-order sidebands may be smaller than 1/3 of that in the case of the continuous interrogation mode using the first-order sidebands.

Therefore, in the atomic oscillator according to the present embodiment, the relative light shift in the case of the pulsed interrogation mode using the third-order sidebands may be smaller than 1/3 of that in the case of the continuous interrogation mode using the first-order sidebands, and the Q value thereof can be increased to 5 times larger than that in the case of the continuous interrogation mode using the first-order sidebands. Further, the power consumption of the RF related circuits in the case of the pulsed interrogation mode using the third-order sidebands can be reduced to one third of that in the case of the continuous interrogation mode using the first-order sidebands, and the short-term frequency stability thereof can be increased to 2.97 times of that in the case of the continuous interrogation mode using the first-order sidebands.

In the foregoing embodiment, for example, a controller may be implemented by the AOM 130, the lock-in amplifier 161, the current driver 162, the function generator 163, the AOM driver 165, the pulse generator 166, the sample/hold circuit 171, the lock-in amplifier 172, the control unit 173, the analog signal generator 174 and the Cs standard unit 175 in the atomic oscillator shown in FIG. 2, such that the controller is configured to generate sidebands including a pair of laser beams with different wavelengths by performing frequency modulation of a carrier on the laser source, configured to cause the pair of laser beams with the different wavelengths to enter the alkali-metal cell, and configured to control a modulation frequency according to optical absorption characteristics of the atoms by quantum interference effects of a pair of resonance laser beams.

In the foregoing embodiment, the case in which the alkali-metal atoms in the alkali-metal cell 140 are formed by cesium atoms has been illustrated. Alternatively, the alkali-metal atoms in the alkali-metal cell 140 may be formed by rubidium atoms instead of cesium atoms. The wavelength of the laser beam emitted by the laser source 110 may fall into any of ranges of 893.6 nm-895.6 nm, 851.3 nm-853.3 nm, 794.0 nm-796.0 nm, and 779.2 nm-781.2 nm. Further, other alkali-metal atoms than those described above (cesium atoms and rubidium atoms), such as sodium atoms or potassium atoms, may be used instead as the alkali-metal atoms in the alkali-metal cell 140.

In the foregoing embodiment, the case in which either the pair of the second-order sidebands or the pair of the third-order sidebands is used has been illustrated. Alternatively, the atomic oscillator may be configured to use a pair of higher-order sidebands including one of the second-order sidebands on one side and one of the third-order sidebands on the other side. Moreover, the atomic oscillator may be configured to use a pair of the sidebands including one of the first-order sidebands on one side and one of the third-order sidebands on the other side. Further, the atomic oscillator may be configured to use a pair of the sidebands including one of the first-order sidebands on one side and one of the second-order sidebands on the other side. Further, the atomic oscillator may be configured to use a fundamental laser wave as the carrier and the third-order sidebands as the pair of the sidebands. In the foregoing, it is assumed that the pair of the sidebands includes a lower-side frequency laser wave as one of the sideband pair and an upper-side frequency laser wave as the other of the sideband pair. Even when fourth-order or higher-order sidebands are used as the sidebands, the same advantageous effects as in the foregoing can be obtained.

Second Embodiment

Next, a second embodiment of the invention will be described. In an atomic oscillator according to the present embodiment, the AOM 130 (FIG. 2) in the atomic oscillator according to the first embodiment is replaced with a liquid crystal element. In the present embodiment, the emitted laser beams from the laser source 110, before entering the alkali-metal cell 140, are modulated into pulsed laser beams by the liquid crystal element. The liquid crystal element is smaller in size than the AOM 130, the power consumption of the liquid crystal element is lower than that of the AOM 130, and further reduction of the power consumption and miniaturization of the atomic oscillator may be attained. In the atomic oscillator according to the present embodiment, the AOM driver 165 (FIG. 2) in the atomic oscillator according to the first embodiment is replaced with a liquid crystal driver, and the liquid crystal driver is provided to control the operation of the liquid crystal element. By using the liquid crystal element, a chip-scale atomic oscillator or clock (CSAC) using the CPT interrogation may be easily produced.

Figure 11:
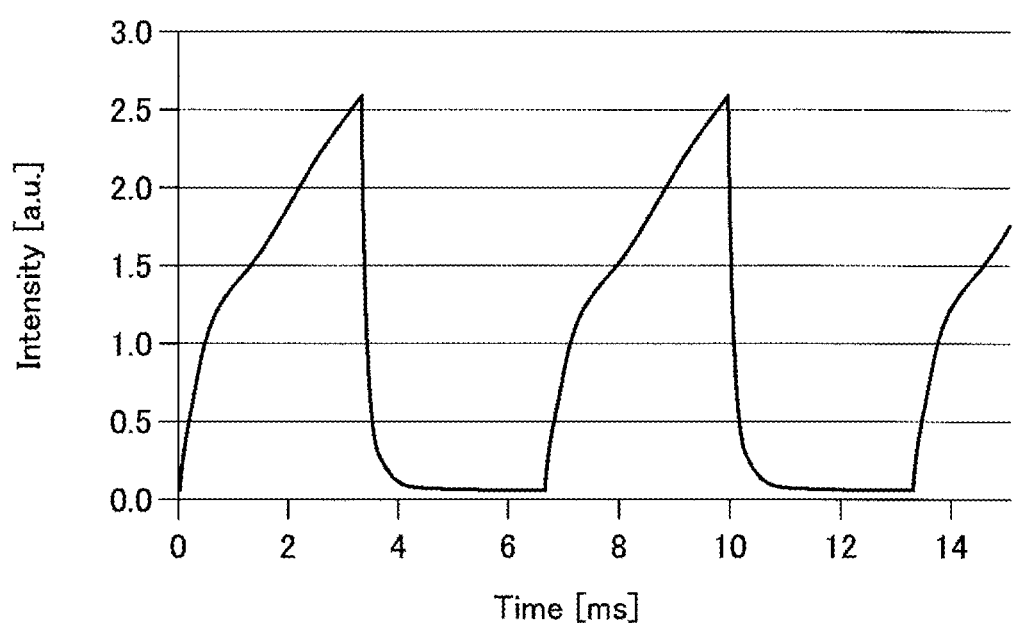
FIG. 11 is a diagram for explaining the waveform of pulsed laser beams in an atomic oscillator according to a second embodiment of the invention.

In the present embodiment, the liquid crystal element is formed from a nematic liquid crystal of a transparent type and two polarizing plates. Pulsed laser beams are produced from the emitted laser beams of the laser source 110 by rotating the planes of polarization of the polarizing plates by 90 degrees relative to each other. FIG. 11 shows the waveform of the pulsed laser beams obtained by the liquid crystal element in the atomic oscillator according to the present embodiment. In the present embodiment, the on/off control of the liquid crystal element is performed, and the pulsed laser beams obtained by the liquid crystal element may have a waveform in the form of an almost triangular wave, instead of the form of a square wave. Specifically, in the waveform of the pulsed laser beams shown in FIG. 11, the switching frequency is 150 Hz, the rising time is 2.65 ms, and the falling time is 218 µs. The atomic oscillator according to the present embodiment may also provide the same advantageous effects as those of the atomic oscillator according to the first embodiment.

According to the invention, it is possible to provide an atomic oscillator and an interrogation method of CPT resonance which are adapted to lower the power consumption.

The atomic oscillator according to the invention is not limited to the above embodiments, and various variations and modifications may be made without departing from the scope of the present disclosure.

The present application is based on and claims the benefit of priority of Japanese Patent Application No. 2012-190180, filed on Aug. 30, 2012, the entire contents of which are hereby incorporated by reference.

The invention claimed is:

1. An atomic oscillator comprising:
    an alkali-metal cell in which alkali-metal atoms are enclosed;
    a light source configured to irradiate the atoms in the alkali-metal cell with laser beams;
    a photodetector configured to detect a light amount of the laser beams passing through the alkali-metal cell to enter the photodetector;
    a controller configured to generate a pair of laser beams with different wavelengths by performing frequency modulation of a carrier on the light source, cause the pair of laser beams with the different wavelengths to enter the alkali-metal cell, and control a modulation frequency according to optical absorption characteristics of the atoms by quantum interference effects of a pair of resonance laser beams, wherein the laser beams entering the alkali-metal cell are pulsed laser beams; and
    a detector configured to detect a Ramsey interrogation signal, in a pulsed interrogation mode,
    wherein the pair of laser beams with the different wavelengths are both third-order sidebands, to permit the modulation frequency for the Ramsey interrogation signal to be reduced.

2. The atomic oscillator according to claim 1, wherein the pulsed laser beams have a waveform in a form of a square wave.

3. The atomic oscillator according to claim 1, wherein the pulsed laser beams have a waveform in a form of a triangular wave.

4. The atomic oscillator according to claim 1, wherein the controller is configured to generate the pulsed laser beams by modulating the laser beams emitted from the light source by using a liquid crystal element.

5. The atomic oscillator according to claim 1, wherein the light source is made of a surface emitting laser.

6. An interrogation method of CPT resonance by an atomic oscillator including an alkali-metal cell in which alkali-metal atoms are enclosed, a light source configured to irradiate the atoms in the alkali-metal cell with laser beams, and a photodetector configured to detect a light amount of the laser beams passing through the alkali-metal cell to enter the photodetector, the interrogation method comprising:
    generating a pair of laser beams with different wavelengths by performing frequency modulation of a carrier on the light source;
    causing the pair of laser beams with the different wavelengths to enter the alkali-metal cell, wherein the laser beams entering the alkali-metal cell are pulsed laser beams;
    detecting a Ramsey interrogation signal, in a pulsed interrogation mode; and
    controlling a modulation frequency according to optical absorption characteristics of the atoms by quantum interference effects of a pair of resonance laser beams,
    wherein the pair of laser beams with the different wavelengths are both third-order sidebands, to permit the modulation frequency for the Ramsey interrogation signal to be reduced.

7. The interrogation method according to claim 6, wherein the pulsed laser beams have a waveform in a form of a square wave.

8. The interrogation method according to claim 6, wherein the pulsed laser beams have a waveform in a form of a triangular wave.

9. The interrogation method according to claim 6, wherein the generating includes generating the pulsed laser beams by modulating the laser beams emitted from the light source by using a liquid crystal element.

10. The interrogation method according to claim 6, wherein the light source is made of a surface emitting laser.

* * * * *